US010139451B2

(12) United States Patent
Wang et al.

(10) Patent No.: US 10,139,451 B2
(45) Date of Patent: Nov. 27, 2018

(54) CONDITIONING CYCLE FOR DETERMINING BATTERY CAPACITY IN AN INFORMATION HANDLING SYSTEM

(71) Applicant: DELL PRODUCTS, L.P., Round Rock, TX (US)

(72) Inventors: Ligong Wang, Austin, TX (US); Dit Charoen, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 268 days.

(21) Appl. No.: 15/008,403

(22) Filed: Jan. 27, 2016

(65) Prior Publication Data

US 2017/0212169 A1 Jul. 27, 2017

(51) Int. Cl.
  *G01R 31/36* (2006.01)
  *H02J 7/00* (2006.01)
(52) U.S. Cl.
  CPC .......... *G01R 31/3634* (2013.01); *H02J 7/007* (2013.01)
(58) Field of Classification Search
  CPC .............................. G01R 31/3634; H02J 7/007
  See application file for complete search history.

(56) References Cited

U.S. PATENT DOCUMENTS

| 7,880,437 | B2 | 2/2011 | Wang et al. | |
|---|---|---|---|---|
| 7,974,797 | B2 | 7/2011 | Shoji | |
| 8,129,946 | B2 | 3/2012 | Wang et al. | |
| 8,179,094 | B2 | 5/2012 | Anupindi | |
| 2009/0024339 | A1* | 1/2009 | Shoji .................. | G01R 31/3624 702/63 |
| 2009/0160402 | A1* | 6/2009 | Wang ................ | H01M 10/4285 320/134 |

* cited by examiner

*Primary Examiner* — Drew A Dunn
*Assistant Examiner* — Sailesh Thapa
(74) *Attorney, Agent, or Firm* — Isidore PLLC (57) ABSTRACT

A method used for determining the capacity of a battery. The method includes determining, via a controller, if the battery has a first capacity sufficient to support a conditioning cycle. In response to determining that the battery has the first capacity sufficient to support the conditioning cycle, the conditioning cycle is activated. The method includes partially discharging the battery at a constant rate while measuring a plurality of battery parameters. A second capacity of the battery is estimated based on the battery parameters measured at the constant discharge rate. The method increases estimation accuracy of the battery's capacity.

19 Claims, 5 Drawing Sheets

FIG. 5

CONDITIONING CYCLE FOR DETERMINING BATTERY CAPACITY IN AN INFORMATION HANDLING SYSTEM

BACKGROUND

1. Technical Field

The present disclosure generally relates to battery management and in particular to determining battery capacity in an information handling system.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some information handling systems utilize batteries as a backup power source. A backup battery is used to provide backup power in the event of primary power loss so that the information handling system can continue to operate or to shut down without data loss. Depending on the application, the loss of data may not be acceptable and may require the battery to have sufficient remaining capacity to handle any required backup functions and tasks. Because the capacity of a battery depends on several variables such as charge/discharge cycles, charge/discharge rate, and end of charge/discharge voltage and temperature, performing periodic battery learning (or conditioning) cycles is required to determine whether the battery has adequate capacity to allow the backup functions to be completed. If the battery does not have adequate capacity to allow the backup functions to be completed, the user or system should take appropriate actions to mitigate the risk of data loss.

One method to determine the battery's capacity is to do a full discharge while taking the appropriate measurements. This method has the disadvantages of adding to the battery degradation as well as making the battery unavailable as the backup source for a longer duration until it is again sufficiently recharged. This method can require the information handling system to experience a period of downtime in order to prevent data loss.

BRIEF SUMMARY

Disclosed are a method, a battery management system, and an information handling system for determining battery capacity in an information handling system (IHS).

According to one embodiment, a method for determining capacity of a backup battery in an IHS is disclosed. The method includes determining, via a controller, if the battery has a first capacity sufficient to support a conditioning cycle and a backup function. In response to determining that the battery has the first capacity, the conditioning cycle is activated. The battery is partially discharged at a constant rate while measuring a plurality of battery parameters. A second capacity of the battery is estimated based on the battery parameters measured at the constant discharge rate. The method increases estimation accuracy of the battery's capacity.

According to another embodiment, a battery management system in an IHS is disclosed. The battery management system comprises a backup battery having a plurality of cells, a constant current discharge circuit coupled to the battery and a controller coupled to the battery. The controller has firmware executing thereon to enable determining the capacity of the battery. The controller determines if the battery has a first capacity sufficient to support a conditioning cycle and a backup function. In response to determining that the battery has the first capacity, the controller activates the conditioning cycle and partially discharges the battery at a constant rate while measuring a plurality of battery parameters. The controller estimates a second capacity of the battery based on the battery parameters measured at the constant discharge rate in order to increase estimation accuracy of the battery's capacity.

According to an additional embodiment, an IHS is disclosed. The IHS comprises a backup battery operable to supply power to the IHS. The battery includes a plurality of cells. A constant current discharge circuit is coupled to the battery. A controller is coupled to the battery. The controller has firmware executing thereon to enable determining the capacity of the battery. The controller determines if the battery has a first capacity sufficient to support the conditioning cycle and a backup function. In response to determining that the battery has the first capacity, the controller activates the conditioning cycle and partially discharges the battery at a constant rate while measuring a plurality of battery parameters. The controller estimates a second capacity of the battery based on the battery parameters measured at the constant discharge rate, in order to increase estimation accuracy of the battery's capacity.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

The illustrative embodiments provide a method, a battery management system, and an information handling system (IHS) to determine battery capacity.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 1:
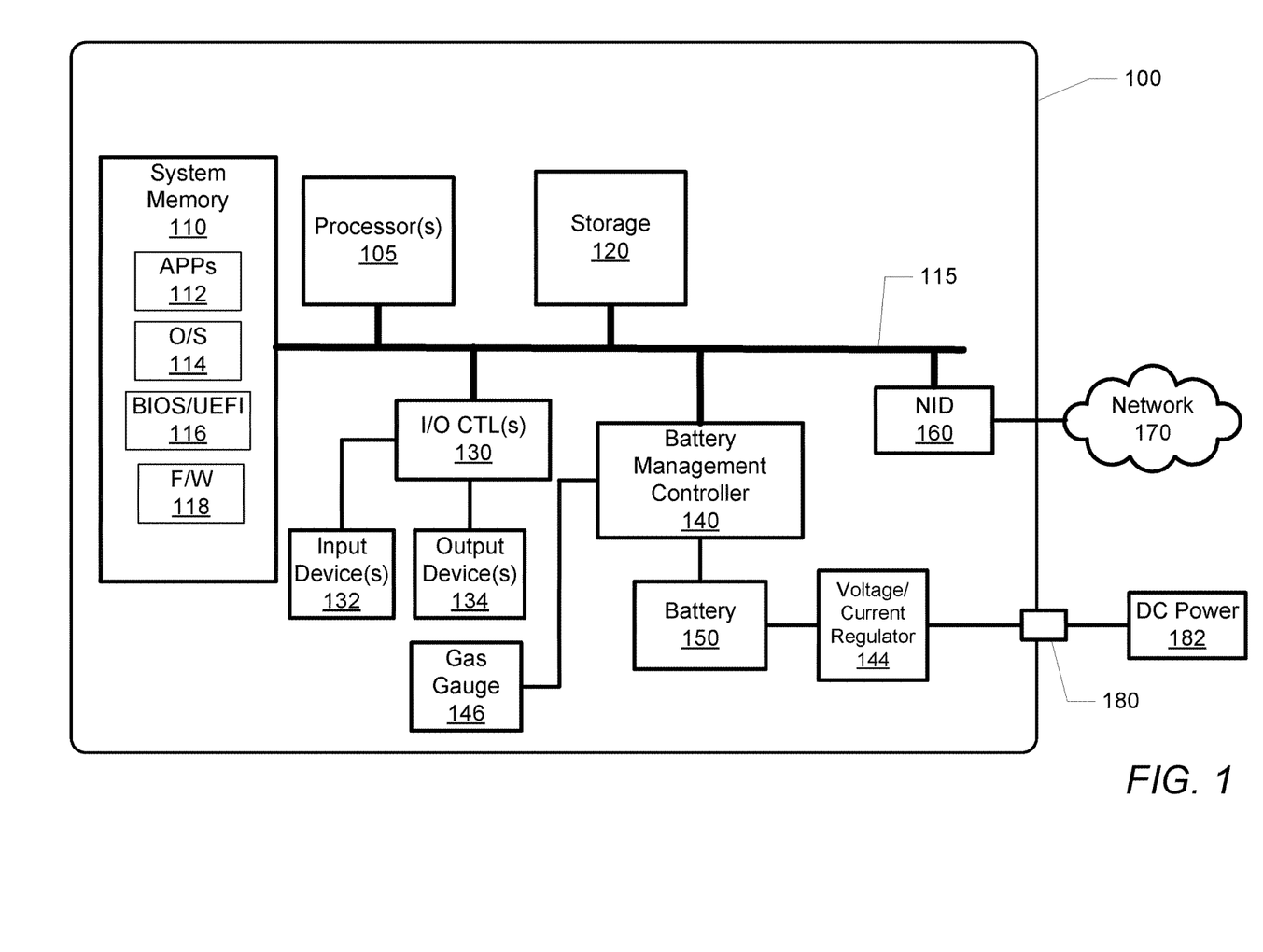
FIG. 1 illustrates an example information handling system (IHS) within which various aspects of the disclosure can be implemented, according to one or more embodiments.

FIG. 1 illustrates a block diagram representation of an example information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, example IHS 100 includes processor(s) 105 coupled to system memory 110 via system interconnect 115. System interconnect 115 can be interchangeably referred to as a system bus, in one or more embodiments. Also coupled to system interconnect 115 is storage 120 within which can be stored one or more software and/or firmware modules and/or data (not specifically shown). In one embodiment, storage 120 can be a hard drive or a solid state drive. The one or more software and/or firmware modules within storage 120 can be loaded into system memory 110 during operation of IHS 100. As shown, system memory 110 can include therein a plurality of software and/or firmware modules including application(s) 112, operating system (O/S) 114, basic input/output system (BIOS) 116 and firmware (F/W) 118.

In one or more embodiments, BIOS 116 comprises additional functionality associated with unified extensible firmware interface (UEFI), and can be more completely referred to as BIOS/UEFI in these embodiments. The various software and/or firmware modules have varying functionality when their corresponding program code is executed by processor(s) 105 or other processing devices within IHS 100.

IHS 100 further includes one or more input/output (I/O) controllers 130, which support connection by, and processing of signals from, one or more connected input device(s) 132, such as a keyboard, mouse, touch screen, or microphone. I/O controllers 130 also support connection to and forwarding of output signals to one or more connected output device(s) 134, such as a monitor or display device or audio speaker(s) or light emitting diodes (LEDs).

Additionally, in one or more embodiments, IHS 100 includes one or more batteries or battery pack(s) 150 that supply power to various components of IHS 100. In one embodiment, battery 150 can be multiple Lithium-ion (Li-ion) cells that are connected either in series or in parallel. Battery 150 can supply a range of voltages and currents depending upon the requirements of IHS 100. Battery 150 can supply a finite amount of power without recharging (often referred to as battery capacity). Battery 150 ages over time and has a limited number of charge-discharge cycles before it reaches the end of its useful life.

IHS 100 further includes a battery management controller (BMC) 140 that is connected to battery 150. Battery management controller 140 can communicate with or is communicatively coupled with processor(s) 105 and with system memory 110 via system interconnect 115. A direct current (DC) power source 182 is connectable to DC power connector 180 to provide power to IHS 100 and to recharge the battery 150. The DC power connector 180 is connected to voltage/current regulator 144 that supplies required DC power to battery 150. Battery 150 is connected to voltage/current regulator 144. In one embodiment, battery 150 can at least partially control the charging of power to and draining of power from battery 150 via voltage/current regulator 144. BMC 140 is also connected to a gas gauge 146. Gas gauge 146 can include a display and can indicate to a user the battery capacity of one or more batteries within IHS 100. Battery 150 can be utilized as a backup battery that provides power to IHS 100 when the primary power source, i.e., when AC power source 182, is removed from IHS 100.

IHS 100 further comprises a network interface device (NID) 160. NID 160 enables IHS 100 to communicate and/or interface with other devices, services, and components that are located external to IHS 100. These devices, services, and components can interface with IHS 100 via an external network, such as example network 170, using one or more communication protocols. In one embodiment, a customer provisioned system/platform can comprise multiple devices located across a distributed network, and NID 160 enables IHS 100 to be connected to these other devices. Network 170 can be a local area network, wide area network, personal area network, and the like, and the connection to and/or between network 170 and IHS 100 can be wired or wireless or a combination thereof. For purposes of discussion, network 170 is indicated as a single collective component for simplicity. However, it is appreciated that network 170 can comprise one or more direct connections to other devices as well as a more complex set of interconnections as can exist within a wide area network, such as the Internet.

The below presented methods of determining the capacity of battery 150 involve performing a partial discharge of battery 150 and estimating the battery's capacity based on measured parameters and known characteristics of the battery cells. This partial discharge method has the advantages of reducing battery wear as compared to the full discharge method. The partial discharge method also enables the battery to concurrently serve as the backup power source without system downtime. A key aspect of the disclosure involves a modification to the methodology of performing the partial discharge in order to prevent and/or overcome problems of inaccurate estimates of the battery capacity that can occur with a conventional partial discharge of the battery. The modifications to the partial discharge methodology provided herein are in part driven by the recognition that (i) under-estimation of the battery capacity can lead to premature battery replacement and increased costs, while (ii) over-estimation of the battery capacity can result in data loss when the battery is called upon to provide backup power and the battery's actual capacity is insufficient to complete the backup process.

Figure 2:
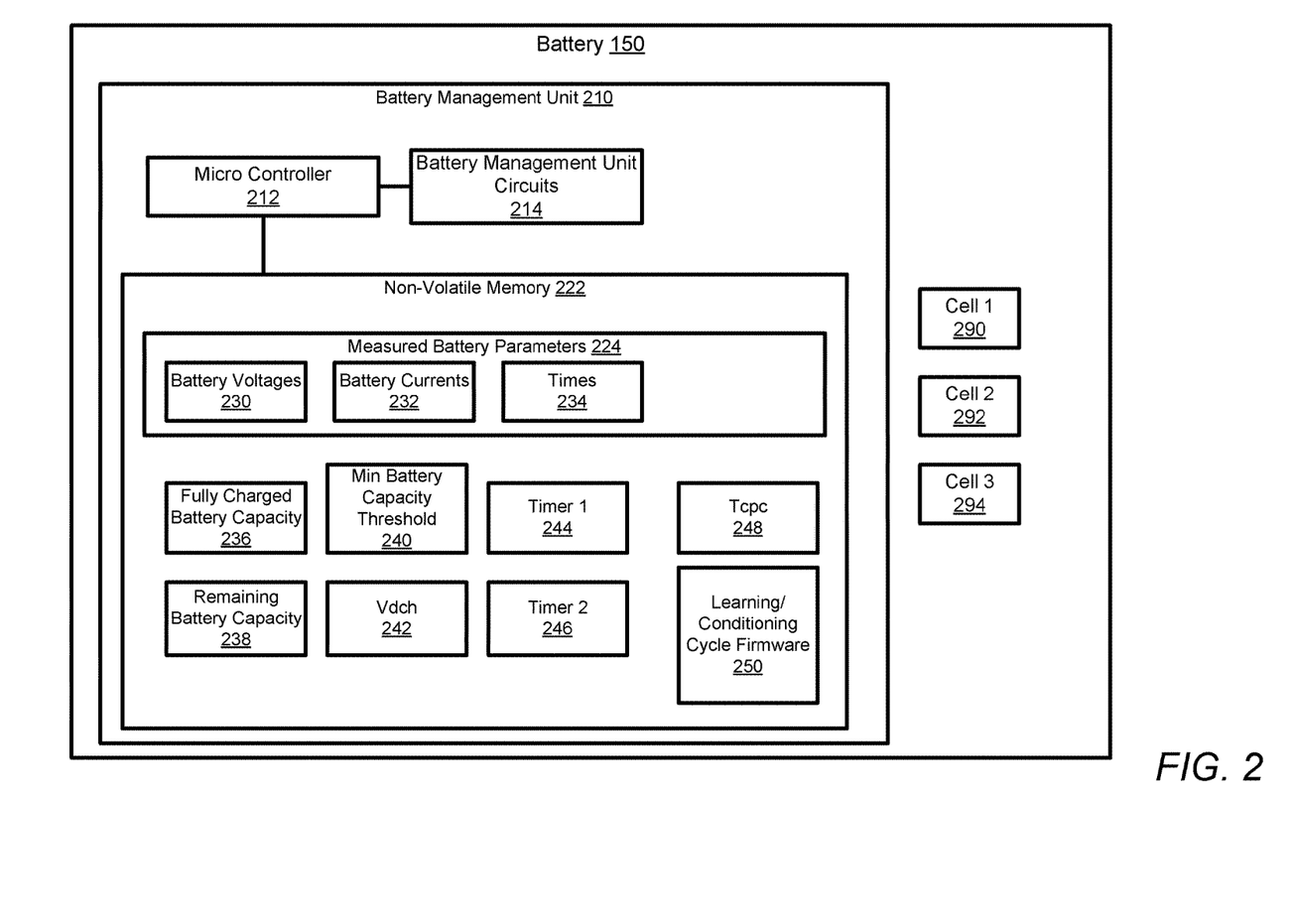
FIG. 2 illustrates a component level view of a battery having a micro-controller and other functional components that support determining the battery capacity, in accordance with one embodiment.

With reference now to FIG. 2, there is illustrated one embodiment of a component level view of battery 150 for which improved estimation accuracy in determining the capacity of battery 150 is supported. In the description of FIG. 2, reference will also be made to components of FIG. 1. Battery 150 comprises battery management unit (BMU) 210 and one or more cells, such as cell 1 290, cell 2 292, and cell 3 294, that can be connected either in series or in parallel.

BMU 210 comprises micro-controller 212, BMU circuits 214, and internal non-volatile memory 222. Each of the components of BMU 210 can be communicatively coupled to each other via one or more circuit lines. Micro-controller 212 can perform one or more methods that enable improved estimation accuracy in determining capacity of battery 150. BMU circuits 214 along with micro-controller 212 can control the charging and discharging of cells 290-294. BMU 210 includes an internal non-volatile memory 222. Non-volatile memory 222 can be a persistent storage device, such as flash memory, that retains data without power. In at least one embodiment, non-volatile memory 222 can store measured battery parameters 224 including battery voltages 230, battery currents 232, and discharge times 234. Measured battery parameters 224 are values measured by BMU circuits 214 during a partial discharge of battery 150. In particular, discharge times 234 are measured elapsed times that battery 150 is discharged at a constant rate such as at a constant current rate and a controlled voltage.

Non-volatile memory 222 also stores fully charged battery capacity 236, an estimated battery capacity 238, minimum battery capacity threshold 240, and discharge voltage Vdch 242. Fully charged battery capacity 236 is the capacity of battery 150 in a fully charged state. In one embodiment, battery capacity can be expressed in units of watt-hours or amp-hours. In another embodiment, battery capacity can be expressed in units of a percentage of a full charge. Estimated battery capacity 238 is an estimate of the capacity of battery 150 resulting from a partial discharge of the battery. Minimum battery capacity threshold 240 is the minimum battery capacity required for operation of IHS 100. Discharge voltage Vdch 242 is the voltage at the end of discharge.

Non-volatile memory 222 further stores timer 1 244 and timer 2 246. Timer 1 244 and timer 2 246 are timers used to track elapsed times during a conditioning cycle. Non-volatile memory 222 further stores learning/conditioning cycle firmware (F/W) 250 that executes within micro-controller 212 to enable the determining of the capacity of battery 150 with improved estimation accuracy. Tcpc 248 is the duration of time to reach the minimum battery capacity threshold 240 at a constant discharge rate.

Figure 3:
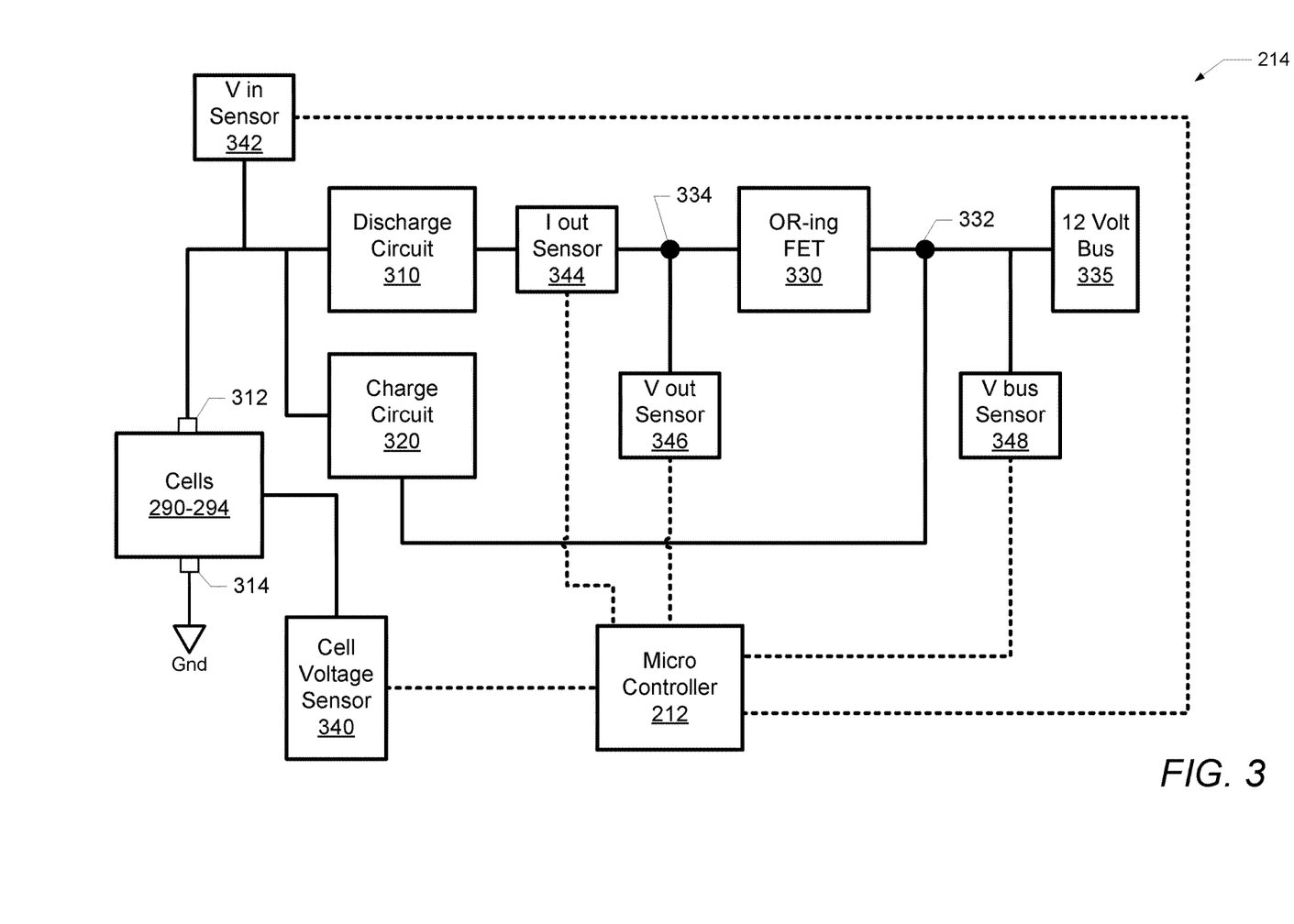
FIG. 3 illustrates details of a backup battery unit circuit, in accordance with one embodiment.

FIG. 3 illustrates details of BMU circuits 214. BMU circuits 214 include a constant current discharge circuit 310 and a charge circuit 320. Constant current discharge circuit 310 and charge circuit 320 are both coupled to the positive terminal 312 of cells 290-294. Cells 290-294 have a negative terminal 314 connected to ground. A voltage input sensor 342 is also coupled to positive terminal 312. Discharge circuit 310 is further coupled to current output sensor 344, which is coupled to node 334 and OR-ing field effect transistor (FET) 330. OR-ing FET 330 is coupled to node 332, which is also coupled to the 12 volt supply bus 335. OR-ing FET 330 is used to protect the 12 volt supply bus 335 and the system in the event that one of the input power sources fails. Bus voltage sensor 348 is coupled to node 332 and a voltage output sensor 346 is coupled to node 334.

A cell voltage sensor 340 is coupled to each of cells 290-294. Micro-controller 212 is communicatively coupled to voltage input sensor 342, current output sensor 344, bus voltage sensor 348, voltage output sensor 346, and cell voltage sensor 340. Micro-controller 212 can receive electrical signals from each of the sensors that are proportional to their measured voltages and currents.

In one embodiment, micro-controller 212 determines if battery 150 has a capacity sufficient to support a conditioning cycle. In response to determining that battery 150 has the capacity sufficient to support the conditioning cycle, micro-controller 212 activates a conditioning cycle. As a part of the conditioning cycle, battery 150 is partially discharged at a constant rate by constant current discharge circuit 310, while a plurality of battery parameters 224 are measured. A capacity of the battery 238 is estimated based on the battery parameters measured at the constant discharge rate. The partial discharge of the battery at a constant rate increases the estimation accuracy of the battery's capacity.

Those of ordinary skill in the art will appreciate that the hardware components and basic configuration depicted in FIGS. 1-3 and described herein may vary. For example, the illustrative components within IHS 100 (FIG. 1) and battery 150 (FIG. 2) and BMU circuits 214 (FIG. 3) are not intended to be exhaustive, but rather are representative to highlight components that can be utilized to implement aspects of the present disclosure. For example, other devices/components may be used in addition to or in place of the hardware depicted. The depicted example does not convey or imply any architectural or other limitations with respect to the presently described embodiments and/or the general disclosure.

Figure 4:
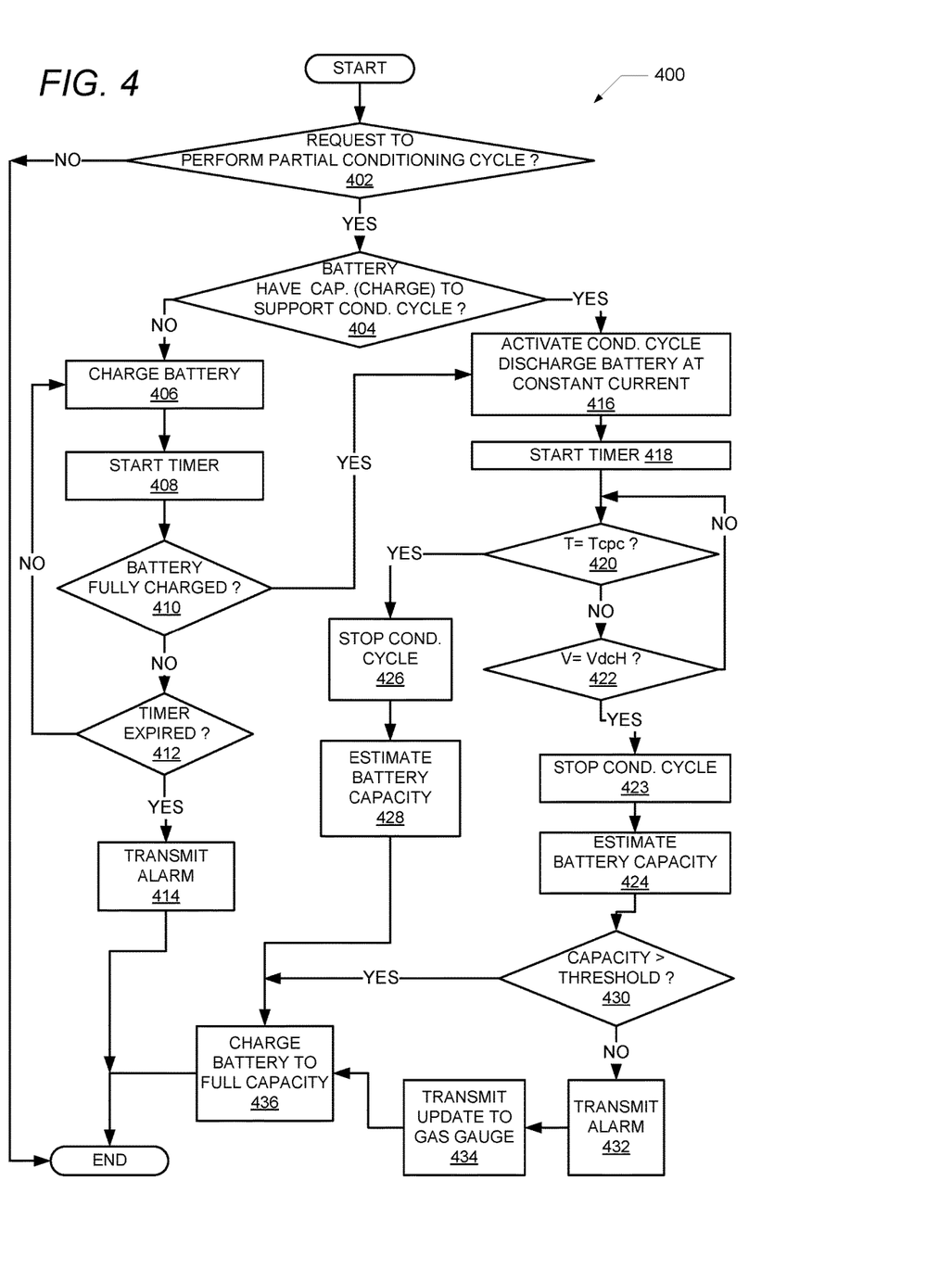
FIG. 4 is a flow chart illustrating one example of the method for improved estimation accuracy in determining battery capacity in an IHS, according to one or more embodiments.

FIG. 4 illustrates a flowchart of an exemplary method 400 by which micro-controller 212 within the preceding figures performs different aspects of the processes that enable the one or more embodiments of the disclosure. Generally, method 400 represents a method to determine the capacity of battery 150. The description of method 400 is provided with general reference to the specific components illustrated within the preceding FIGS. 1-3. Generally, method 400 is described as being implemented via micro-controller 212 and particularly the execution of code provided by learning/conditioning cycle firmware 250 within micro-controller 212. It is however appreciated that certain aspects of the described methods may be implemented via other devices and/or can involve execution of other code.

Method 400 begins at the start block and proceeds to decision block 402 where micro-controller 212 determines if a request to perform a partial conditioning cycle on battery 150 has been received. In one embodiment, micro-controller 212 can receive the request to perform a partial conditioning cycle from BMC 140. In response to determining that a request to perform a partial conditioning cycle on battery 150 has not been received, method 400 ends. In response to determining that a request to perform a partial conditioning cycle on battery 150 has been received, micro-controller 212 determines if battery 150 has a first capacity (charge) sufficient to support the conditioning cycle (decision block 404).

In response to determining that the battery does not have the first capacity sufficient to support the conditioning cycle, micro-controller 212 charges the cells 290-294 of battery 150 (block 406) and starts timer 1 244 (block 408). At decision block 410, micro-controller 212 determines if battery 150 is fully charged. In response to battery 150 not being fully charged, micro-controller 212 determines if timer 1 244 has expired (decision block 412). In response to timer 1 244 not being expired, micro-controller 212 returns to block 406 where micro-controller 212 continues to charge battery 150. In response to timer 1 244 being expired, micro-controller 212 transmits an alarm to BMC 140 indicating that battery 150 has not fully charged (block 414).

In response to battery 150 being fully charged, micro-controller 212 activates the conditioning cycle by partially discharging battery 150 at a constant rate while measuring several battery parameters (block 416). Discharging battery 150 at a constant rate can include using discharge circuit 310 to discharge battery 150 at a constant current and a controlled voltage. In one embodiment, discharge circuit 310 discharges the battery 150 through a load of IHS 100 (via 12 volt bus 335) during normal operation of IHS 100. During the discharge of battery 150, battery parameters 224 are measured including battery voltages 230, battery currents 232, and elapsed discharge times 234. Battery voltages 230 can be measured by voltage sensors 340, 342, 346 and 348. Battery currents 232 can be measured by current sensor 344. Elapsed discharge times 234 can be measured by micro-controller 212. Micro-controller 212 starts timer 2 246 (block 418)

At decision block 420, micro-controller 212 determines if the elapsed time of timer 2 246 is equal to a pre-determined threshold time Tcpc 248. Tcpc 248 is the duration of time to reach the minimum battery capacity threshold 240 at a constant discharge rate. In response to the elapsed time of timer 2 246 not being equal to Tcpc 248, micro-controller 212 determines if the real time battery voltage (as measured by Vin sensor 342) is equal to threshold battery voltage (i.e., end of discharge voltage Vdch 242) (block 422). In response to the real time battery voltage not being equal to Vdch 242, micro-controller 212 continues to determine if the elapsed time of timer 2 246 is equal to a pre-determined threshold time Tcpc 248 at decision block 420.

In response to the elapsed time of timer 2 246 being equal to Tcpc 248, micro-controller 212 stops or terminates the conditioning cycle (block 426) and estimates the battery capacity 238 (block 428). Micro-controller 212 then charges the cells 290-294 of battery 150 back to a full charge (capacity) at block 436. Method 400 then ends. The discharge at a constant rate is to continue until either T=Tcpc or V=Vdch, whichever is reached first. Tcpc is the duration at constant discharge rate corresponding to the minimum battery capacity threshold 240. If T=Tcpc is reached first, this means that V>Vdch and battery 150 is good. If V=Vdch is reached first, battery 150 is bad.

In response to the real time battery voltage being equal to Vdch 242, micro-controller 212 stops or terminates the conditioning cycle (block 423) and estimates the battery capacity 238 (block 424). Micro-controller 212 determines if the capacity of the battery 238 exceeds a predetermined minimum threshold capacity 240 of the battery (decision block 430). In response to determining that the capacity of the battery 238 is below the predetermined minimum threshold capacity 240 of the battery, micro-controller 212 transmits an alarm to BMC 140 indicating that battery 150 does not have the minimum capacity to support operation of IHS 100 (block 432). Micro-controller 212 transmits an update of the capacity of the battery 238 to BMC 140 such that BMC 140 can update gas gauge 146 (block 434). In response to determining that the capacity of the battery 238 exceeds the predetermined minimum threshold capacity 240 of the battery, micro-controller 212 charges the cells 290-294 of battery 150 back to a full charge (capacity) (block 436). Method 400 then ends.

The use of a constant current discharge rate of battery 150 via the constant current discharge circuit 310 during the conditioning cycle of method 400 provides an increase in estimation accuracy of the battery's capacity 238. With a known constant discharge rate (constant current), the time required to discharge from a fully charged voltage to end of discharge voltage Vdch can be measured. Next, a simple product of the two values (constant current*time) yields the amount of discharge or the capacity discharged in amp-hours with high accuracy and thus improves the estimation accuracy of the battery's capacity, reducing the estimation error. In addition, over the life of the battery, the constant discharge rate and the controlled voltage during each particular conditioning cycle can be adjusted by micro-controller 212 to reduce wear and extend the battery life.

Figure 5:
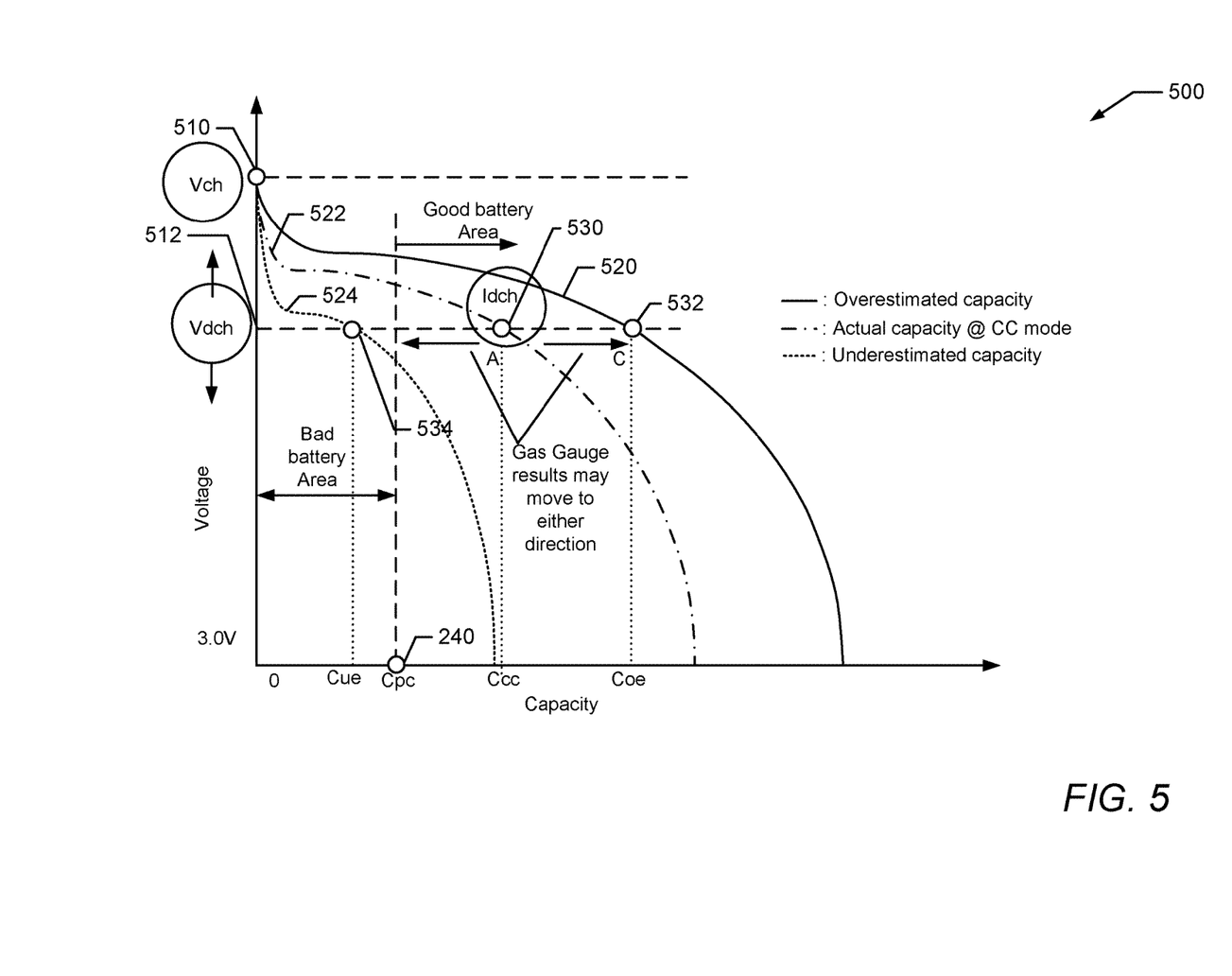
FIG. 5 is a graph of voltage versus battery capacity illustrating the use of the method for improved estimation accuracy in determining battery capacity, according to one or more embodiments.

FIG. 5 illustrates a graph 500 of battery voltage versus capacity. Battery 150 can be discharged from fully charged voltage Vch 510 to end of discharge voltage Vdch 512. Graph 500 includes three different battery voltage versus capacity curves 520, 522 and 524. The three curves can be viewed in one of two ways. In the first way, and as labeled, curve 520 represents an overestimated capacity of battery 150. Curve 522 represents the actual capacity of battery 150 and curve 524 represents an underestimated capacity of battery 150. In the second way of viewing the curves, curve 520 can represent the characterized discharge profile of a new or fresh battery. Curve 522 can represent the characterized discharge profile of a mid-life battery and curve 524 can represent the characterized discharge profile of an end-of-life battery. In the first way of viewing the three curves, when the discharge rate is variable (not constant current), the actual capacity at the end of a discharge cycle (point 530) can be overestimated to be at point 532 or underestimated to be at point 534. If, as shown, the underestimated capacity at point 534 is below the minimum battery capacity threshold 240 (Cpc) then the battery is deemed degraded or bad when the battery is not in actuality.

In the second way of viewing the three curves 520, 522 and 524, when the discharge rate is constant, the curves remain exactly the same if the x-axis is discharge time (where t=0 is the start of the constant discharge rate) instead of capacity. In other words, a new or fresh battery takes longer to discharge to Vdch at point 532 compared to a mid-life battery at point 530. And a mid-life battery takes longer to discharge compared to an end-of-life battery (point 534). In other words, as a battery wears, its discharge profile moves from right to left. As mentioned previously, with a known constant discharge rate (constant current), the time required to discharge from Vch 510 to Vdch 512 can be measured and a simple product of the two values (constant current*time) yields the amount of discharge or the capacity discharged in amp-hours with high accuracy. When this is then compared against the known characterized discharge profile, it results in an improved and accurate estimation of the battery's capacity. Switching back now to the first way of viewing the three curves, a conditioning cycle using method 400 enables points 532 and 534 and their curves to move closer to point 530 and its curve reducing the estimation error of the battery's capacity.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, a micro-controller or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entire hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method for determining capacity of a battery in an information handling system (IHS), the method comprising:
   determining, via a controller, if the battery has a first capacity sufficient to support a conditioning cycle and a backup function;
   in response to determining that the battery has the first capacity:
      partially discharging the battery at a constant discharge rate to a predetermined voltage threshold or for a fixed period of time while reserving enough battery capacity to support required system backup functions and while measuring a plurality of battery parameters;
      estimating a second capacity of the battery by comparing battery parameters measured at the constant discharge rate to predetermined values, in order to increase an estimation accuracy of the battery's capacity;
      determining if the second capacity of the battery exceeds a predetermined threshold capacity of the battery;
      in response to determining that the second capacity of the battery exceeds the predetermined threshold capacity of the battery, charging the battery, via a power source, to a full charge; and
      in response to determining that the second capacity of the battery does not exceed the predetermined threshold capacity of the battery, transmitting an alarm.

2. The method of claim 1, wherein: the condition cycle is activated in response to the battery having the first capacity; and partially discharging the battery further comprises discharging the battery at a constant current discharge rate and a controlled voltage.

3. The method of claim 2, wherein discharging the battery at the constant current discharge rate and the controlled voltage is performed via a constant current discharge circuit coupled to the IHS.

4. The method of claim 1, wherein the battery is discharged at a constant rate through a load of the IHS during operation of the IHS.

5. The method of claim 1, further comprising:
   identifying whether the battery has a full charge, wherein the first capacity is the full charge;
   in response to the battery having the full charge, activating the conditioning cycle by discharging the battery from the full charge at the constant rate;
   determining if a real time battery voltage is less than the predetermined voltage threshold; and
   in response to determining that the real time battery voltage is less than the predetermined voltage threshold, terminating the conditioning cycle.

6. The method of claim 1 further comprising:
   in response to determining that the battery does not have the first capacity sufficient to support the conditioning cycle, charging the battery.

7. A battery management system in an information handling system (IHS), the battery management system comprising:
   a battery having a plurality of cells;
   a constant current discharge circuit coupled to the battery;
   a controller coupled to the battery, the controller having firmware executing thereon to enable determining capacity of the battery, wherein the controller:
      determines if the battery has a first capacity sufficient to support a conditioning cycle;
      in response to the battery having the first capacity:
         partially discharges the battery at a constant rate to a predetermined voltage threshold or for a fixed period of time, while reserving enough battery capacity to support required system backup functions and while measuring a plurality of battery parameters; and
         estimates a second capacity of the battery by comparing battery parameters measured at the constant discharge rate to predetermined values, in order to increase an estimation accuracy of the battery's capacity;
      determines if the second capacity of the battery exceeds a predetermined threshold capacity of the battery;
      in response to determining that the second capacity of the battery exceeds the predetermined threshold capacity of the battery, charges the battery to a full charge; and
      in response to determining that the second capacity of the battery does not exceed the predetermined threshold capacity of the battery, transmits an alarm.

8. The battery management system of claim 7, wherein the controller activates the conditioning cycle and partially discharges the battery by discharging the battery at a constant current discharge rate and a controlled voltage.

9. The battery management system of claim 8, wherein discharging the battery at the constant current discharge rate and the controlled voltage is performed via the constant current discharge circuit.

10. The battery management system of claim 7, wherein the battery is discharged at a constant rate through a load of the IHS during operation of the IHS.

11. The battery management system of claim 7, wherein the controller:
   identifies whether the battery has a full charge, wherein the first capacity is the full charge;
   in response to the battery having the full charge, activates the conditioning cycle by discharges the battery from the full charge at the constant rate;
   determines if a real time battery voltage is less than the predetermined voltage threshold; and
   in response to determining that the real time battery voltage is less than the predetermined voltage threshold, terminates the conditioning cycle.

12. The battery management system of claim 11, wherein:
   the IHS comprises a power source electrically coupled to the battery and which can be used to selectively charge the battery.

13. The battery management system of claim 7, wherein the controller:
   in response to determining that the battery does not have the first capacity sufficient to support the conditioning cycle, charges the battery.

14. An information handling system (IHS) comprising:
   a battery operable to supply power to the IHS, the battery including a plurality of cells;
   a constant current discharge circuit coupled to the battery;
   a controller coupled to the battery, the controller having firmware executing thereon to determine a capacity of the battery, wherein the controller:
      determines if the battery has a first capacity sufficient to support a conditioning cycle;
      in response to determining that the battery has the first capacity: partially discharges the battery at a constant rate to a predetermined voltage threshold or for a fixed period of time, while reserving enough battery capacity to support required system backup functions and while measuring a plurality of battery parameters; and estimates a second capacity of the battery by comparing battery parameters measured at the constant discharge rate to predetermined values, in order to increase an estimation accuracy of the battery's capacity;
      determines if the second capacity of the battery exceeds a predetermined threshold capacity of the battery;
      in response to determining that the second capacity of the battery exceeds the predetermined threshold capacity of the battery, charges the battery to a full charge; and
      in response to determining that the second capacity of the battery does not exceed the predetermined threshold capacity of the battery, transmits an alarm.

15. The information handling system of claim 14, wherein the controller activates the conditioning cycle and partially discharges the battery by discharging the battery at a constant current discharge rate and a controlled voltage.

16. The information handling system of claim 15, wherein discharging the battery at the constant current discharge rate and the controlled voltage is performed via the constant current discharge circuit.

17. The information handling system of claim 14, wherein the battery is discharged at a constant rate through a load of the IHS during operation of the IHS.

18. The information handling system of claim 14, wherein the controller:
   identifies whether the battery has a full charge, wherein the first capacity is the full charge;
   in response to the battery having the full charge, activates the conditioning cycle by discharging the battery from the full charge at the constant rate;
   determines if a real time battery voltage is less than the predetermined voltage threshold; and
   in response to determining that the real time battery voltage is less than the predetermined voltage threshold, terminates the conditioning cycle.

19. The information handling system of claim 18, wherein:
   the IHS comprises a power source electrically coupled to the battery and which can be used to selectively charge the battery.

* * * * *